(12) United States Patent
Vogel et al.

(10) Patent No.: US 7,599,412 B2
(45) Date of Patent: Oct. 6, 2009

(54) METHOD AND ELECTRONIC CIRCUIT FOR CONTROLLING OF A SUPPLY VOLTAGE OF A LASER DIODE

(75) Inventors: Patrick Vogel, Villingen-Schwenningen (DE); Steffen Lehr, Villingen-Schwenningen (DE)

(73) Assignee: Thomson Licensing, Boulogne Billancourt (FR)

( * ) Notice: Subject to any disclaimer, the term of this patent is extended or adjusted under 35 U.S.C. 154(b) by 864 days.

(21) Appl. No.: 10/759,727

(22) Filed: Jan. 16, 2004

(65) Prior Publication Data

US 2004/0145992 A1 Jul. 29, 2004

(30) Foreign Application Priority Data

Jan. 21, 2003 (EP) ................... 03001169

(51) Int. Cl.
*H01S 3/13* (2006.01)
(52) U.S. Cl. .............................. 372/29.015; 372/38.01; 372/38.04; 372/38.07; 372/38.02
(58) Field of Classification Search ................ 372/38.1, 372/38.04, 38.07, 38.02; 307/31, 39, 74
See application file for complete search history.

(56) References Cited

U.S. PATENT DOCUMENTS 6,363,044 B1 * 3/2002 Lehr et al. ............... 369/53.27

2005/0030985 A1 * 2/2005 Diaz et al. ............. 372/29.015

FOREIGN PATENT DOCUMENTS

EP 1111745 6/2001

* cited by examiner

*Primary Examiner*—Minsun Harvey
*Assistant Examiner*—Delma R Forde
(74) *Attorney, Agent, or Firm*—Robert D. Shedd; Joseph J. Opalach; Reitseng Lin

(57) ABSTRACT

The invention relates to a method for initializing a control of a supply voltage of a light source, such as a laser diode, the light source being arranged in a first circuit configuration having an associated first reference voltage level or the light source being arranged in an alternative second circuit configuration having an associated alternative second reference voltage level, the method comprising the steps of gradually changing the supply voltage into the direction of the first reference voltage, measuring a light emission of the light source while gradually changing the supply voltage, if no light emission is measured: starting the control of the supply voltage of the light source after the first reference voltage has been reached and if a light emission is measured gradually changing the supply voltage into the direction of the second reference voltage and starting the control of the supply voltage of the light source after the second reference voltage has been reached.

16 Claims, 6 Drawing Sheets

Figure 1:
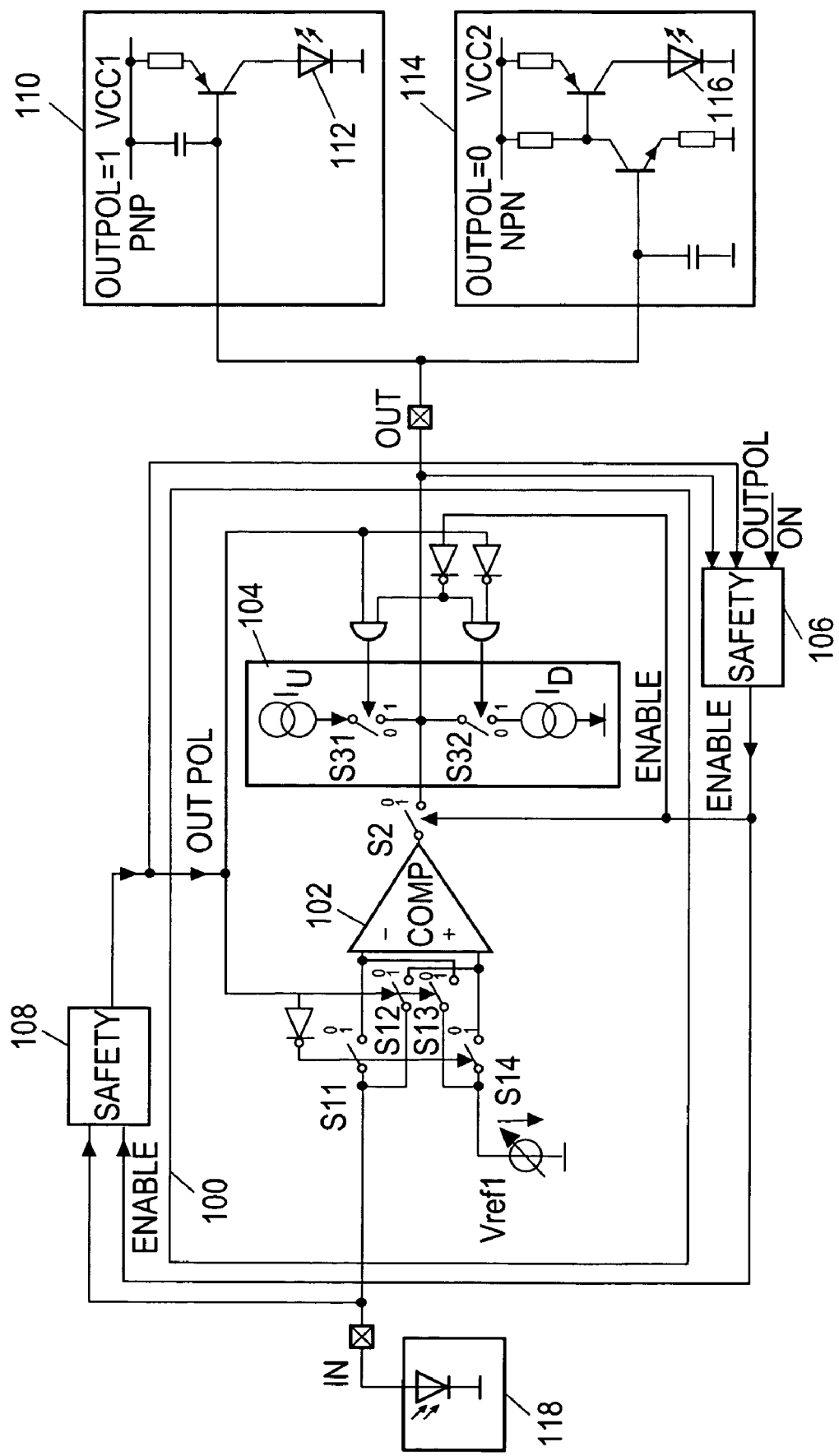

METHOD AND ELECTRONIC CIRCUIT FOR CONTROLLING OF A SUPPLY VOLTAGE OF A LASER DIODE

FIELD OF THE INVENTION

The present invention generally relates to the field of controlling of light sources, and more particularly to controlling of a laser diode of an optical reader and/or recorder, such as CD or DVD players and/or recorders.

BACKGROUND OF THE INVENTION

Typically a laser diode is arranged in a PNP type circuit configuration or, alternatively, in an NPN type circuit configuration. The control of the supply voltage of the laser diode needs to be adapted to the type of circuit configuration which is used, otherwise the lifetime of the laser diode is reduced or the laser diode is even destroyed when the control of the power supply is initialized.

U.S. Pat. No. 6,363,044 B1 shows a photo diode detection circuit which is used to automatically identify a type of photo diode circuit connected to it. Once the type of photo diode circuit has been identified by applying a current to it and evaluating a voltage occurring at an input of the detection circuit, the photo detection circuit adapts itself to it, e.g. a reverse biasing voltage is or is not applied to the photo diode of the photo diode circuit. The result is a photo diode detection circuit which uses a forward or a reversed biased photo diode. The photo diode detection circuit is now in a state to measure light falling on the photo diode. The detection circuit is used for monitoring the light intensity of a light source and for a controlling circuit which enables to regulate the intensity of the light source. It is a disadvantage of this prior art controlling circuit that it does not automatically adapt to the circuit configuration in which the light source is arranged.

SUMMARY OF THE INVENTION

It is an object of the invention to find a solution for a control circuit and method which automatically adapts to the circuit configuration in which a laser diode is arranged.

A solution to the above described problem is provided by applying the features laid down in the respective independent claims. Preferred embodiments of the invention are given in the dependent claims.

The invention enables an effective protection of a light source, such as a laser diode, against application of a wrong supply voltage. It is a particular advantage of the present invention that this accomplished without a need for an extra control pin and without inputting of control information indicating the kind of circuit configuration of the laser diode. Rather the present invention enables to automatically detect the circuit configuration of the laser diode and to initialize the control of the power supply for the laser diode correspondingly.

The present invention is advantageously employed for optical readers and/or recorders such as CD and/or DVD readers and/or recorders.

BRIEF DESCRIPTION OF PREFERRED EMBODIMENTS

Figure 2:
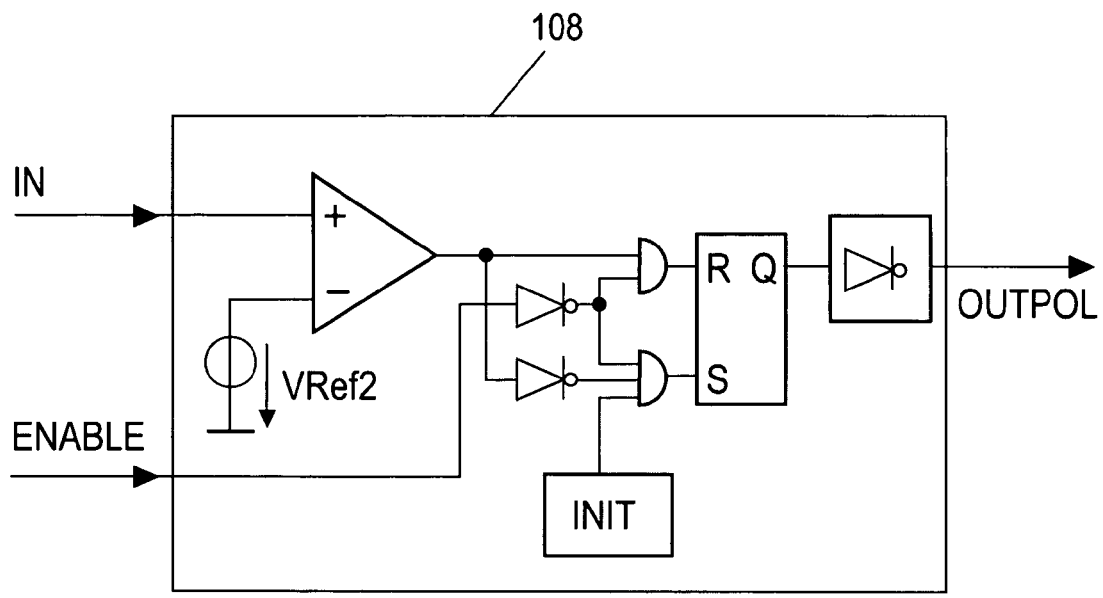
Figure 3:
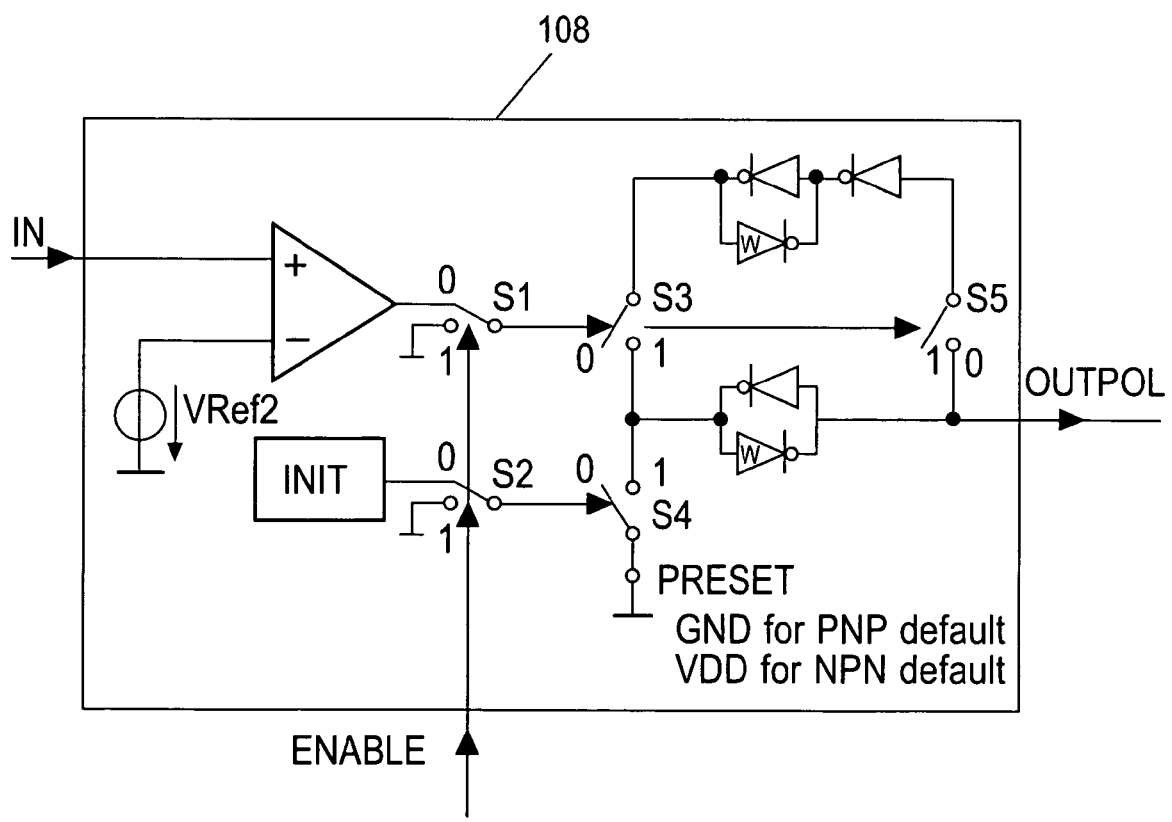
Figure 4:
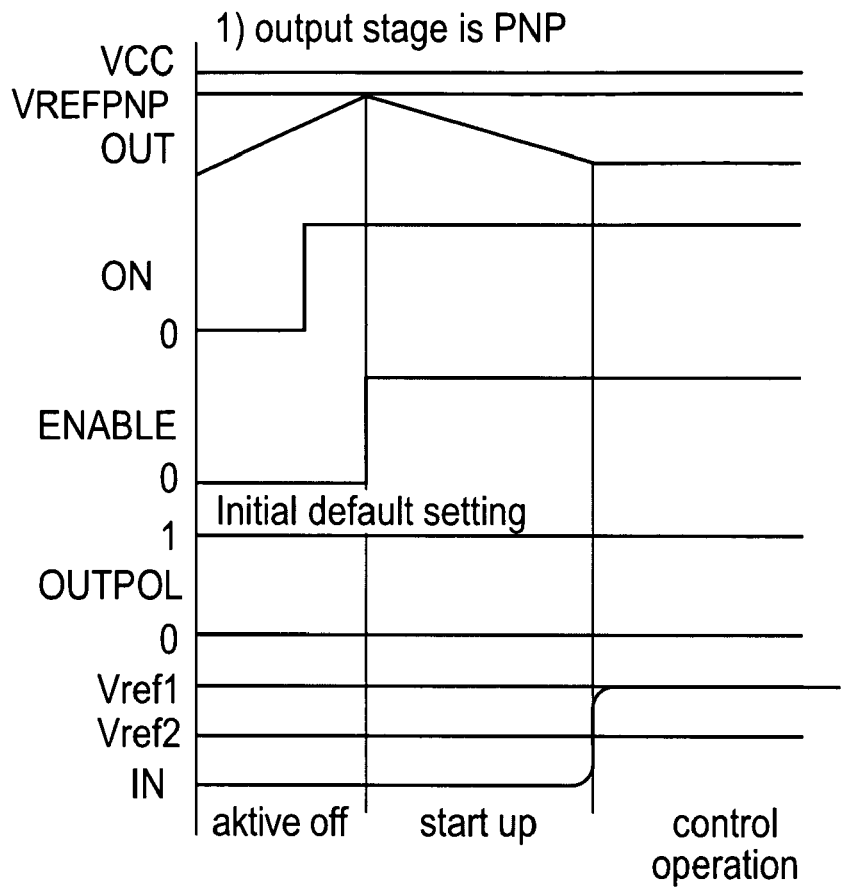
Figure 5:
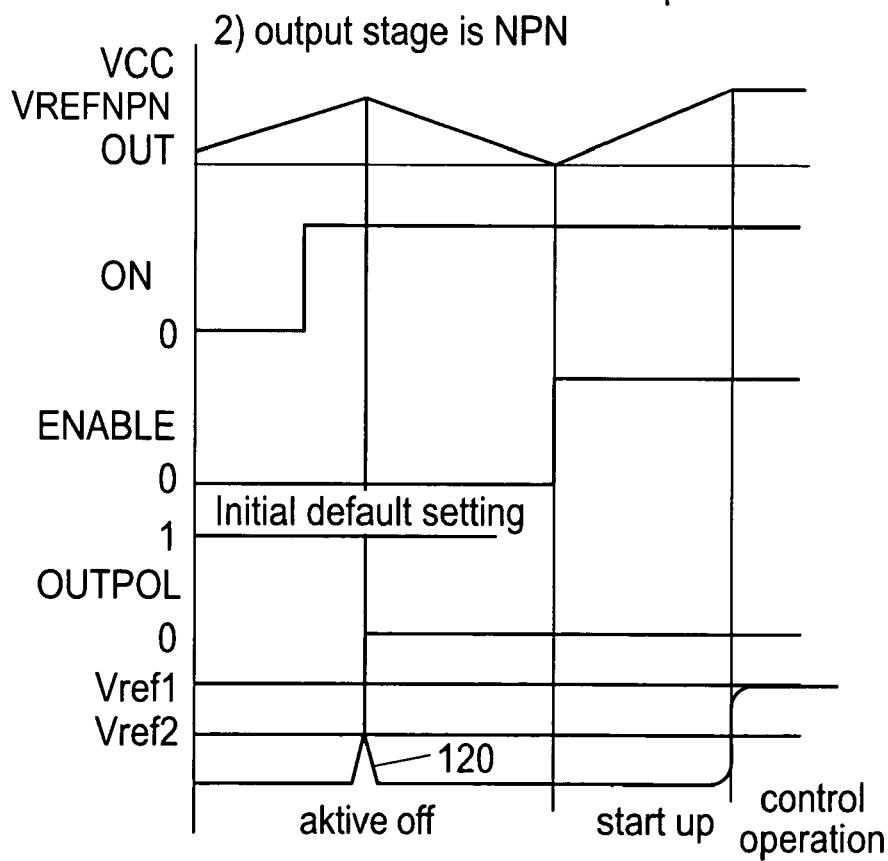
Figure 6:
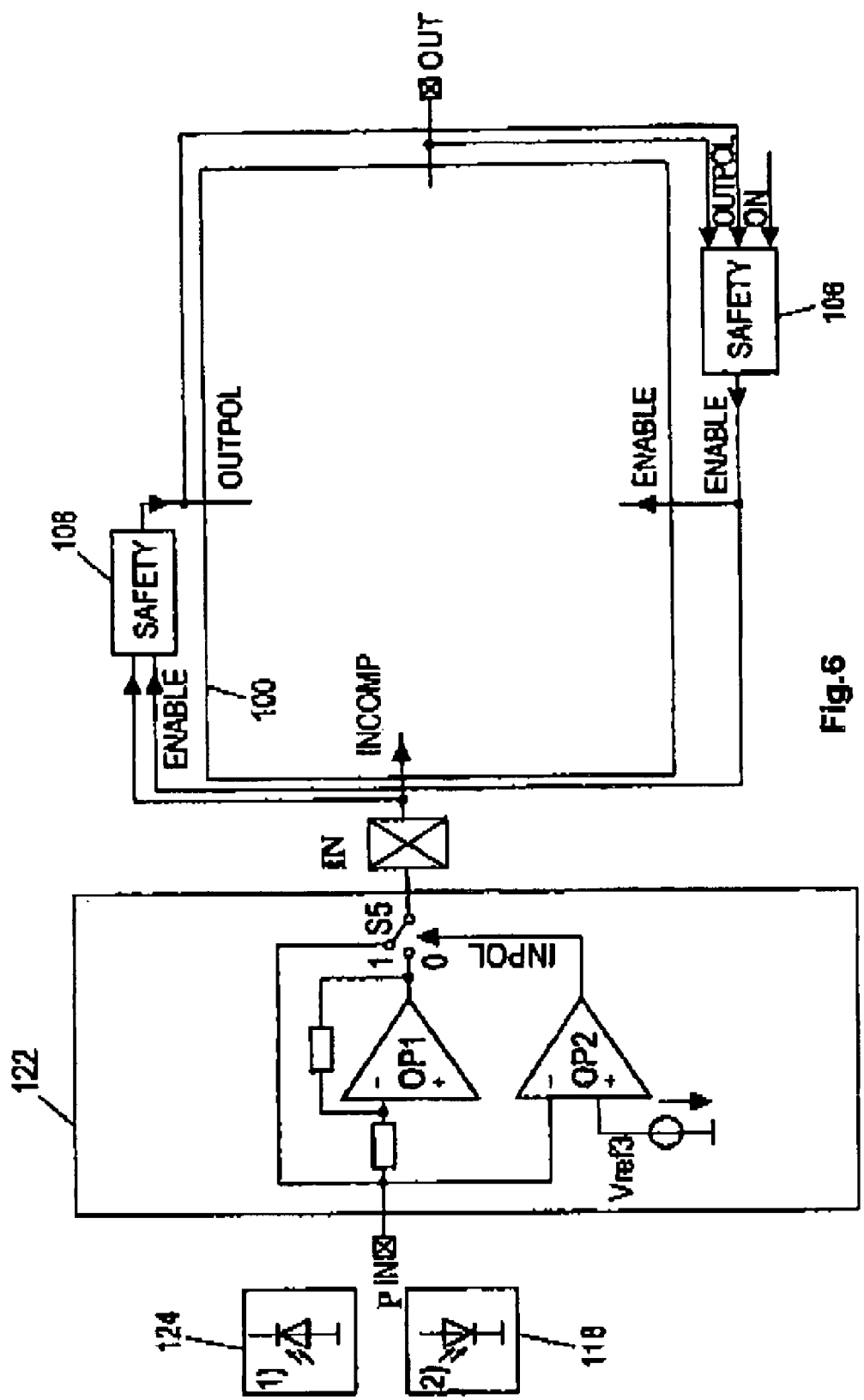

In the following preferred embodiments of the invention will be described in greater detail by making reference to the drawings in which:

FIG. 1 shows a block diagram of an embodiment of an electronic circuit of the invention, FIG. 2 shows a detailed view on the module of FIG. 1 generating the OUTPOL signal, FIG. 3 is an alternative embodiment of the circuit of FIG. 2, FIG. 4 is illustrative of a signal diagram when the output stage is of the PNP type, FIG. 5 is illustrative of a signal diagram when the output stage is of the NPN type, FIG. 6 shows an alternative embodiment of the circuit of FIG. 1 having an additional detector for the polarity of the measurement signal, FIG. 7 to FIG. 10 are illustrative of signal diagrams of the preferred embodiment of FIG. 6

DETAILED DESCRIPTION OF PREFERRED EMBODIMENTS

FIG. 1 shows a control circuit 100 having a comparator 102. The comparator 102 has input switches S11, S12, S13 and S14 which determine the output polarity of the comparator 102. The input voltage at pin IN of the comparator 102 is compared with an adjustable reference voltage Vref1.

Further control circuit 100 has an active off circuitry 104, which comprises two current sources Iu Id as well as switches S31 and S32.

A safety block 106 is coupled to the control circuit 100. The safety block 106 decides when the laser control switches from the active off phase into the start up phase. The safety block 106 generates an ENABLE signal when the command ON is applied and if the start up condition (external capacitors are de-charged) are fulfilled.

Further there is a safety block 108 which is coupled to the control circuit 100. Safety block 108 serves to determine whether the laser diode which is controlled by the control circuit 100 is in a PNP type or an NPN type circuit configuration. Preferred implementations of safety block 108 are illustrated in FIGS. 2 and 3.

A PNP type circuit configuration 110 having a laser diode 112 or alternatively an NPN type circuit configuration 114 comprising laser diode 116 is connected to the output OUT of control circuit 100. The PNP type circuit configuration 110 is a driver circuit for the laser diode 112 using an PNP transistor type. Likewise the NPN type circuit configuration 114 is a driver circuit for laser diode 116 using an NPN transistor type.

A measurement photo diode 118 is connected to the input IN of the control circuit 100. The photo diode 118 measures the light emission of the laser diode 112 or laser diode 116, respectively. This way a feedback signal is provided to control circuit 100 which forms the basis for controlling the supply voltage for laser diode 112, or laser diode 116.

The voltage control of the control circuit 100 is adapted by the OUTPOL signal delivered by the safety block 108 depending whether PNP type circuit configuration 110 or NPN type circuit configuration 114 is connected to the output OUT of control circuit 100. In particular the polarity of the comparator 102 and also the active OFF circuitry 104 is adapted accordingly depending on the OUTPOL signal. The operation of the control circuit 100 has several operation modes:

Active OFF

The external capacitance of the PNP type circuit configuration 110 or the NPN type circuit configuration 114 is de-charged, so that the laser diode 112 or 116, respectively is OFF. This is a safety requirement in order to avoid destruction of the expensive laser diodes 112 or 116.

Active ON

The laser control is switched off when the start up phase is entered. During the start up phase safety functions are checked and the external capacitors are charged.

control phase

When all safety checks have been fulfilled the control circuit 100 enters the control phase. The laser diode light emission is regulated based on the reference voltage Vref1.

FIG. 2 is illustrative of an implementation of the safety block 108. FIG. 3 is illustrative of an alternative implementation of the safety block 108 which is preferred to the implementation of FIG. 2. The INIT block generates a pulse of about 100 nanoseconds pulse length when the supply voltage has reached its nominal value. With this pulse the OUTPOL signal is set to a default setting. For example the default setting is OUTPOL=1 which means that the PNP type circuit configuration 110 (cf. FIG. 1) is the default circuit configuration. Alternatively the NPN type circuit configuration 114 can be chosen as a default configuration.

FIG. 4 is illustrative of the initialization of the control of the supply voltage depending on the type of circuit configuration. In the embodiment of FIGS. 4 and 5, it is assumed that the default setting is OUTPOL=1, which means that PNP type circuit configuration 110 is the default circuit configuration.

FIG. 4 shows the signal diagram if the circuit configuration of the laser diode is indeed of the PNP type circuit configuration 110.

During the active OFF phase the supply voltage at the output OUT is gradually increased towards the reference voltage Vrefpnp of the PNP type circuit configuration 110 (cf. FIG. 1). At the same time the measurement signal applied at the input IN is monitored. As the measurement signal applied at the input IN does not show a peak this means that the assumption that the laser diode is in the PNP type circuit configuration 110 is correct and that the polarity of the signal OUTPOL does not need to be changed from the default setting. After the active OFF and the start up phase, the control operation for controlling the supply voltage starts.

FIG. 5 shows a corresponding signal diagram when the output circuit configuration is not the default PNP type circuit configuration but an NPN type circuit configuration. Again the supply voltage at the output OUT of the control circuit is gradually increased towards the reference voltage VREFPNP of the PNP type circuit configuration 110 as the PNP type circuit configuration is the assumed configuration. As the laser diode is in fact arranged in an NPN type circuit configuration application of the gradually increasing supply voltage results in the emission of light from the laser diode and thus in a peak 120 of the measurement signal applied at the input IN.

In response to the peak 120 the polarity of the OUTPOL signal is changed from 1 to 0 and the direction of change of the supply voltage signal at the output OUT is likewise changed into the direction of the voltage reference Vrefnpn of NPN type circuit configuration 114.

FIG. 6 shows a block diagram of an extended embodiment based on the embodiment of FIG. 1. In the embodiment of FIG. 6 there is photo diode detection circuit 122 between the input IN and the input of control circuit 100. Preferably photo diode detection circuit 122 is designed in accordance with U.S. Pat. No. 6,363,044B1, which is incorporated herein by reference in its entirety.

Due to the photo diode detection circuit 122 it is possible to either use photo diode 118 or reverse biased photo diode 124. In either case the photo diode detection circuit 122 will deliver the same signal INCOMP for inputting into the comparator 102 of the control circuit 100 (cf. FIG. 1).

Figure 7:
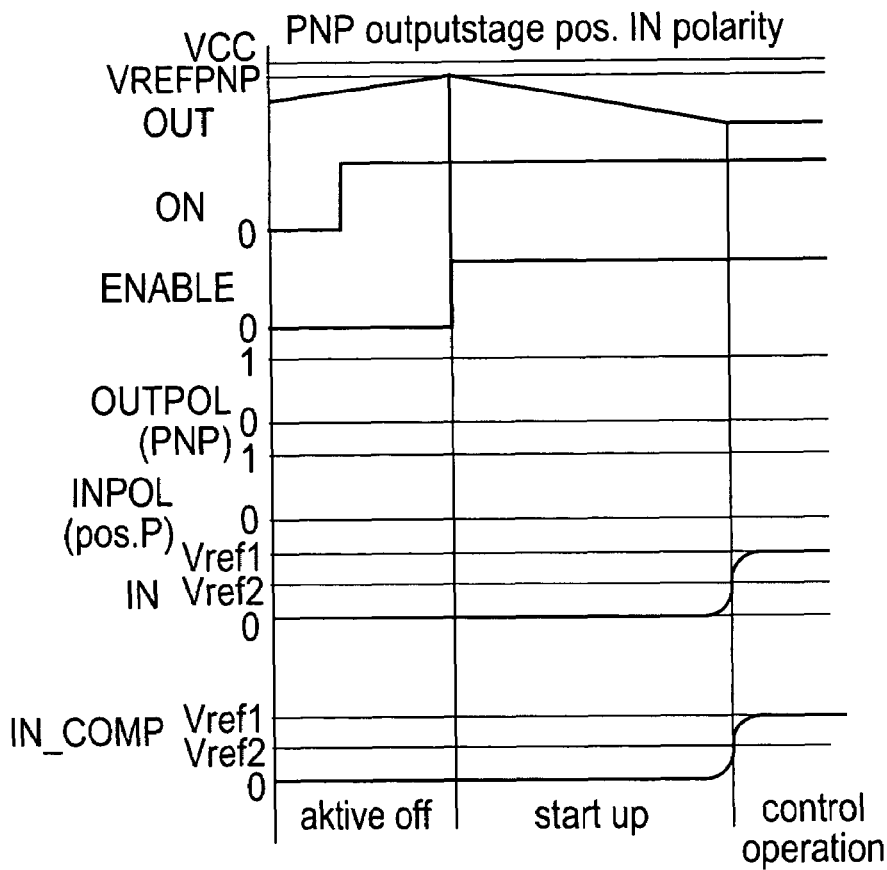
Figure 8:
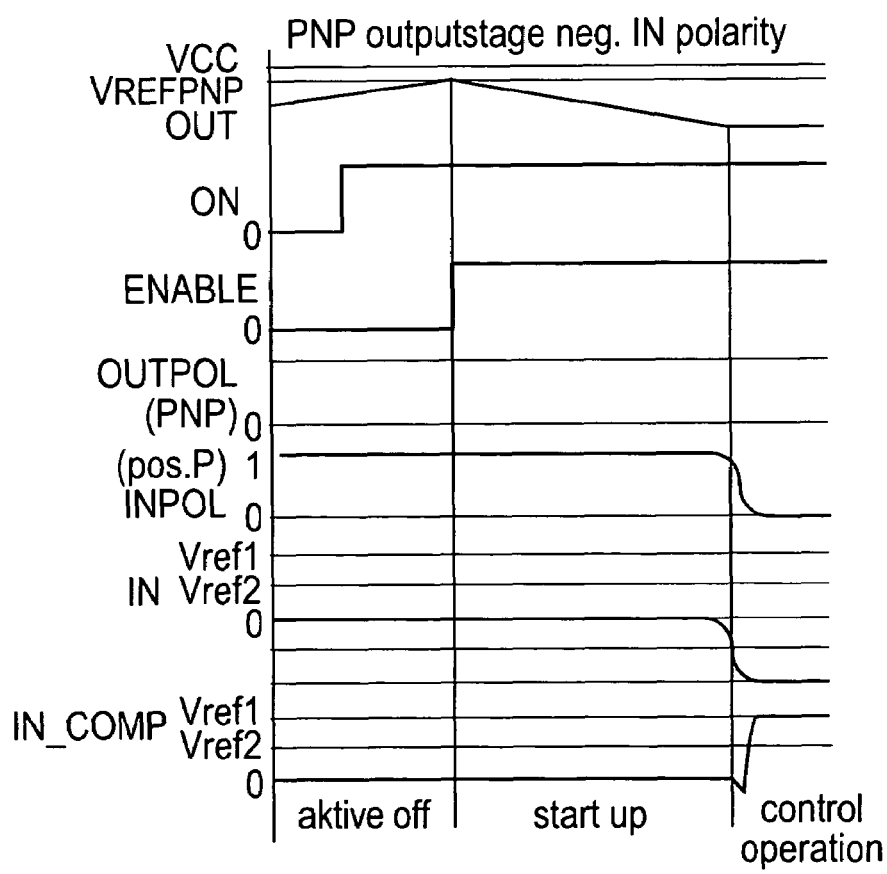

As apparent from the signal diagrams of FIGS. 7 to 10, the operation of the control circuit 100 is the same irrespective of whether photo diode 118 or photo diode 124 is used. FIG. 7 shows the signal diagram where the laser diode is arranged in the default PNP type circuit configuration and diode 118 is used. FIG. 8 shows the situation where diode 124 is used. In this instance the polarity of the INPOL signal is changed, such that switch S5 of photo diode detection circuit 122 (cf. FIG. 6) is switched from its '1' to its '0' position.

Figure 9:
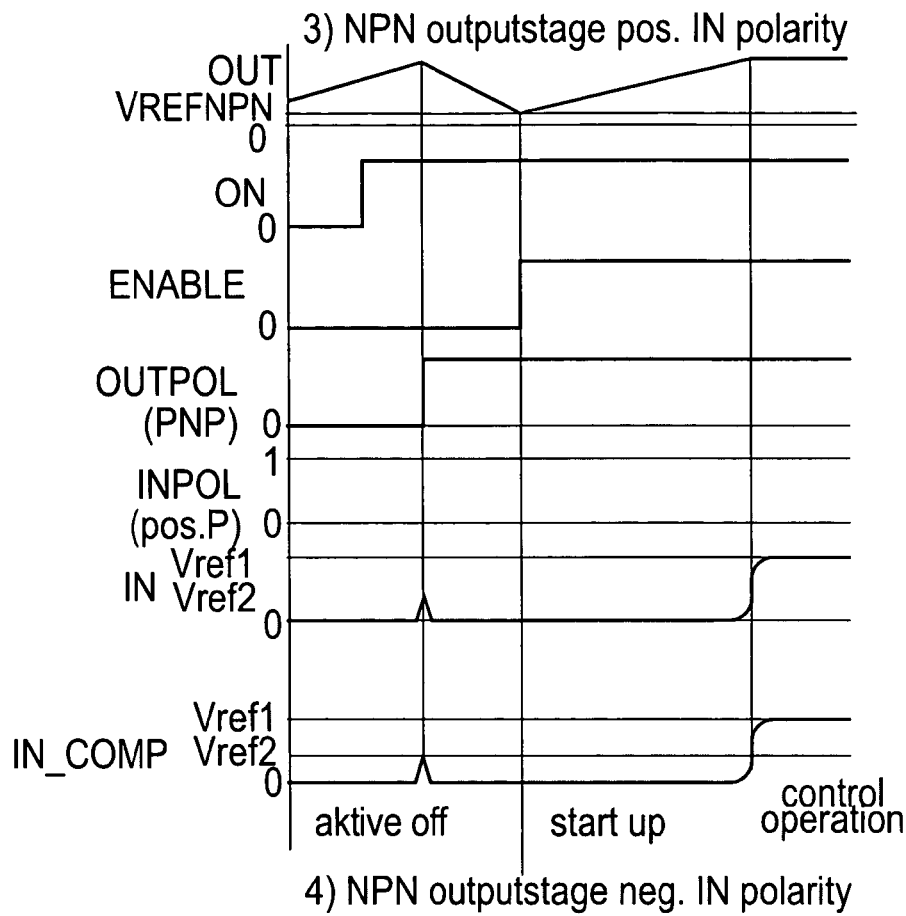
Figure 10:
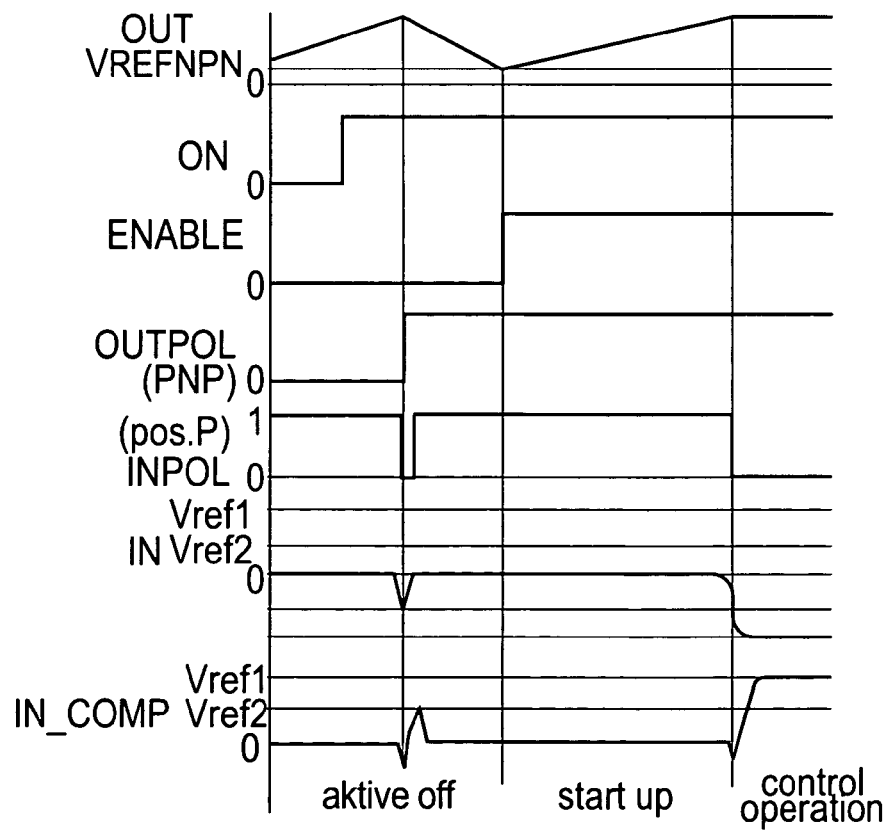

FIGS. 9 and 10 show the corresponding signal diagrams for a laser diode being arrange in an NPN type circuit configuration.

What is claimed, is:

1. A method for controlling a supply voltage of a light source, the light source being arranged in one of a first circuit configuration having an associated first reference voltage level and a second circuit configuration having an associated second reference voltage level, the method comprising the steps of:

gradually changing the supply voltage into a direction of the first reference voltage level;

measuring light emission of the light source while gradually changing the supply voltage into the direction of the first reference voltage level;

if no light emission is measured during the measuring step, determining that the light source is arranged in the first circuit configuration and controlling the supply voltage after the first reference voltage level has been reached; and if a light emission is measured during the measuring step, determining that the light source is arranged in the second circuit configuration and gradually changing the supply voltage into a direction of the second reference voltage level and controlling the supply voltage after the second reference voltage level has been reached and the first circuit configuration includes a PNP type circuit configuration and the second circuit configuration includes an NPN type circuit configuration.

2. The method according to claim 1, wherein the measuring step is performed using a photodiode.

3. An electronic circuit for controlling a supply voltage of a light source, the light source being arranged in one of a first circuit configuration having an associated first reference voltage level and a second circuit configuration having an associated second reference voltage level, the electronic circuit comprising:

means for gradually changing the supply voltage into a direction of the first reference voltage level;

means for detecting light emission of the light source while the supply voltage is gradually changed into the direction of the first reference voltage level;

means for gradually changing the supply voltage into a direction of the second reference voltage level if a light emission of the light source is detected while the supply voltage is gradually changed into the direction of the first reference voltage level; and means for determining that the light source is arranged in the first circuit configuration if no light emission of the light source is detected while the supply voltage is gradually changed into the direction of the first reference voltage level, and for determining that the light source is arranged in the second circuit configuration if the light emission of the light source is detected while the supply voltage is gradually changed into the direction of the first reference voltage level and the first circuit configuration includes a PNP type circuit configuration and the second circuit configuration includes an NPN type circuit configuration.

4. The electronic circuit according to claim 3, wherein the light source comprises a laser diode.

5. An optical device, comprising:
   means for gradually changing a supply voltage of a light source of the optical device into a direction of a reference voltage level;
   means for detecting light emission of the light source while the supply voltage is gradually changed into the direction of the reference voltage level;
   means for determining that the light source is arranged in a first circuit configuration if no light emission of the light source is detected while the supply voltage is gradually changed into the direction of the reference voltage level, and for determining that the light source is arranged in a second circuit configuration different from the first circuit configuration if the light emission of the light source is detected while the supply voltage is gradually changed into the direction of the reference voltage level and the first circuit configuration includes a PNP type circuit and the second circuit configuration includes an NPN type circuit configuration.

6. A method for automatically adapting a circuit to a light source, such as a laser diode, for protecting the light source against application of a wrong supply voltage and supply current respectively, the fight source being arranged in a first circuit configuration having an associated first reference voltage level or the light source being arranged in an alternative second circuit configuration having an associated alternative second reference voltage level, the method comprising:
   a first step of performing an active off phase with a first safety circuit and two current sources of different polarity by generating an initialisation pulse in the first safety circuit when a power supply voltage is applied for providing a signal for driving a current provided by one of the current sources through the output to which one of the light sources is applied and for selecting a control direction of a comparator according to the polarity of the selected current source, and wherein said signal for driving and selecting becomes changed by said first safety circuit as soon as a photo detector applied to said first safety circuit detects light emitted by the applied light source to control said light source in said active off phase for detecting the circuit configuration of the light source and adapting the control direction of the comparator according to the circuit configuration of the light source connected to the circuit;
   a second step of performing with a second safety circuit a start up phase for checking whether the active off phase to control said light source in an off state has been performed, switching off the current source and for providing an enable signal if said light source being in an off state or a switching on of the light source is requested and said light source being in an off state and wherein said enable signal connects the output of the comparator to the output of the circuit connected with said light source; and
   a third step of performing a control operation of the light source with said comparator by comparing a signal provided by said photo detector with a reference signal connected to said comparator.

7. The method according to claim 1, wherein the light source comprises a laser diode.

8. The electronic circuit according to claim 3, wherein the means for detecting light emission of the light source comprises a photodiode.

9. The optical device according to claim 5, wherein the light source comprises a laser diode.

10. The optical device according to claim 5, wherein the means for detecting light emission of the light source comprises a photodiode.

11. The optical device according to claim 5, wherein the optical device is a DVD player.

12. The optical device according to claim 5, wherein the optical device is a CD player.

13. A method for operating an optical device, the method comprising the steps of:
   gradually changing a supply voltage of a light source of the optical device into a direction of a reference voltage level;
   measuring light emission of the light source while gradually changing the supply voltage into the direction of the reference voltage level;
   if no light emission is measured during the measuring step, determining that the light source is arranged in a first circuit configuration;
   if a light emission is measured during the measuring step, determining that the light source is arranged in a second circuit configuration different from the first circuit configuration and the first circuit configuration includes a PNP type circuit and the second circuit configuration includes an NPN type circuit configuration.

14. The method according to claim 13, wherein the optical device is a DVD player.

15. The method according to claim 13, wherein the optical device is a CD player.

16. The method according to claim 13, wherein the light source comprises a laser diode.

* * * * *

UNITED STATES PATENT AND TRADEMARK OFFICE
CERTIFICATE OF CORRECTION

PATENT NO. : 7,599,412 B2 Page 1 of 1
APPLICATION NO. : 10/759727
DATED : October 6, 2009
INVENTOR(S) : Vogel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1535 days.

Signed and Sealed this

Twenty-eighth Day of September, 2010

David J. Kappos
*Director of the United States Patent and Trademark Office*